(12) United States Patent
Xue et al.

(10) Patent No.: US 12,575,467 B2
(45) Date of Patent: Mar. 10, 2026

(54) SEMICONDUCTOR PACKAGE HAVING REDUCED PARASITIC INDUCTANCE

(71) Applicant: ALPHA AND OMEGA SEMICONDUCTOR INTERNATIONAL LP, Toronto (CA)

(72) Inventors: Yan Xun Xue, Los Gatos, CA (US); Lin Chen, San Jose, CA (US); Long-Ching Wang, Cupertino, CA (US); Hui Ye, San Jose, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 846 days.

(21) Appl. No.: 17/946,992

(22) Filed: Sep. 16, 2022

(65) Prior Publication Data

US 2024/0096768 A1 Mar. 21, 2024

(51) Int. Cl.
| | |
|---|---|
| *H01L 23/495* | (2006.01) |
| *H01L 23/00* | (2006.01) |
| *H01L 23/31* | (2006.01) |

(52) U.S. Cl.
CPC .... *H01L 23/49575* (2013.01); *H01L 23/3107* (2013.01); *H01L 23/49517* (2013.01); *H01L 23/49524* (2013.01); *H01L 23/49541* (2013.01); *H01L 23/49548* (2013.01); *H01L 23/49562* (2013.01); *H01L 24/37* (2013.01); *H01L 24/40* (2013.01); *H01L 24/84* (2013.01); *H01L 2224/40137* (2013.01); *H01L 2224/84* (2013.01); *H01L 2924/1306* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 8,450,149 B2* | 5/2013 | Bayan | ............... | H01L 23/49562 |
| | | | | 257/676 |
| 9,230,949 B2* | 1/2016 | Zhang | ..................... | H01L 22/14 |
| 9,293,397 B1* | 3/2016 | Yilmaz | ............. | H01L 23/49524 |
| 11,094,617 B2* | 8/2021 | Xue | ......................... | H10D 1/20 |
| 11,688,671 B2* | 6/2023 | Xue | .................. | H01L 23/49541 |
| | | | | 257/675 |
| 2008/0012045 A1* | 1/2008 | Muto | ................ | H01L 23/49562 |
| | | | | 438/117 |
| 2015/0325559 A1* | 11/2015 | Niu | ......................... | H01L 24/92 |
| | | | | 438/107 |

(Continued)

*Primary Examiner* — Alonzo Chambliss
(74) *Attorney, Agent, or Firm* — Chen-Chi Lin

(57) ABSTRACT

A semiconductor package includes a lead frame, a low side field-effect transistor (FET), a high side FET, a metal clip, and a molding encapsulation. The low side FET is flipped and is attached to a first die paddle of the lead frame. The lead frame comprises one or more voltage input (Vin) leads; a gate lead; one or more switching node (Lx) leads; a first die paddle; a second die paddle; and an end paddle. Each of an exposed bottom surface of the one or more Lx leads is directly connected to an exposed bottom surface of the end paddle. A longitudinal direction of an exposed bottom surface of the gate lead is perpendicular to a longitudinal direction of each of the exposed bottom surface of the one or more Lx leads. An entirely of each of the one or more Vin leads is of the full thickness.

19 Claims, 6 Drawing Sheets

(56) References Cited

U.S. PATENT DOCUMENTS

| 2017/0236754 | A1* | 8/2017 | Shibuya | H01L 21/78 |
| | | | | 438/112 |
| 2018/0277513 | A1* | 9/2018 | Macheiner | H01L 23/49844 |
| 2019/0103342 | A1* | 4/2019 | Neugirg | H01L 24/92 |
| 2021/0343630 | A1* | 11/2021 | Xue | H01L 23/49575 |

* cited by examiner

SEMICONDUCTOR PACKAGE HAVING REDUCED PARASITIC INDUCTANCE

FIELD OF THE INVENTION

This invention relates generally to a semiconductor package. More particularly, the present invention relates to a semiconductor package having a reduced size with reduced parasitic inductance.

BACKGROUND OF THE INVENTION

It is challenging to reduce a size of a semiconductor package while improving or maintaining heat dissipation capability, parasitic inductance, voltage spikes, reliability performance, efficiency, and power density.

The advantage of present disclosure includes reduction of semiconductor package size; reduction of cost; reduction of parasitic inductance; reduction of voltage spike of a high side FET thereby improving the reliability performance of the semiconductor package; increase of efficiency; and increase of power density.

SUMMARY OF THE INVENTION

The present invention discloses a semiconductor package comprising a lead frame, a low side field-effect transistor (FET), a high side FET, a metal clip, and a molding encapsulation. The low side FET is flipped and is attached to a first die paddle of the lead frame.

The lead frame comprises one or more voltage input (Vin) leads; a gate lead; one or more switching node (Lx) leads; a first die paddle; a second die paddle; and an end paddle. Each of an exposed bottom surface of the one or more Lx leads is directly connected to an exposed bottom surface of the end paddle. A longitudinal direction of an exposed bottom surface of the gate lead is perpendicular to a longitudinal direction of each of the exposed bottom surface of the one or more Lx leads. A distance between a center of a first flat portion of the metal clip contacting the low side FET and a center of a second flat portion of the metal clip contacting the high side FET is less than 2.4 mm. An entirely of each of the one or more Vin leads is of the full thickness.

DETAILED DESCRIPTION OF THE INVENTION

Figure 1:
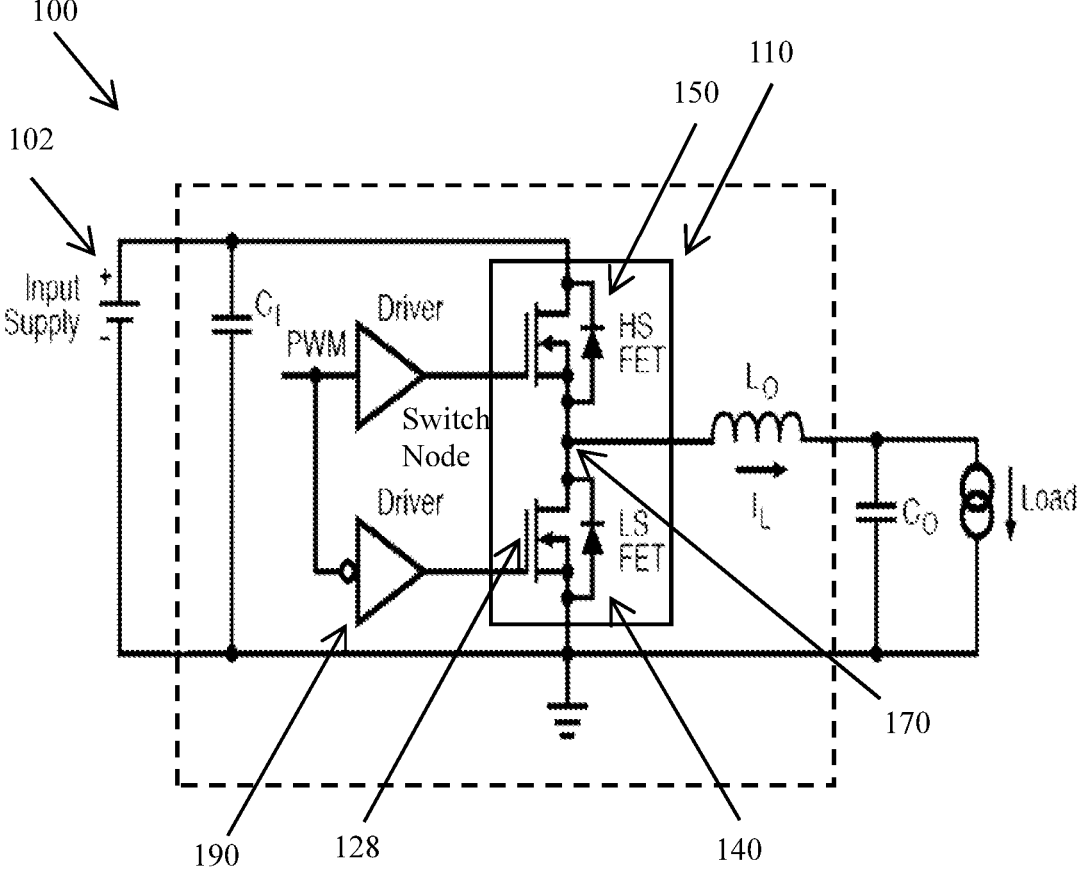
FIG. 1 is a circuit of a conventional DC-DC converter.

FIG. 1 is a circuit of a conventional DC-DC converter 100. The DC-DC converter 100 comprises a low side field-effect transistor (FET) 140 and a high side FET 150. The low side FET 140 and the high side FET 150 may be co-packaged in a same semiconductor package 110. Voltage input supply 102 is provided for the DC-DC converter 100 at a drain connection of the high side FET 150. A drain of the low side FET 140 is coupled to a source of the high side FET 150 via a switching node 170 while a source of the low side FET 140 is coupled to ground. A gate 128 of the low side FET 140 is coupled to a driver 190 and a gate of the high side FET 150 is coupled to a separate driver.

Figure 2A:
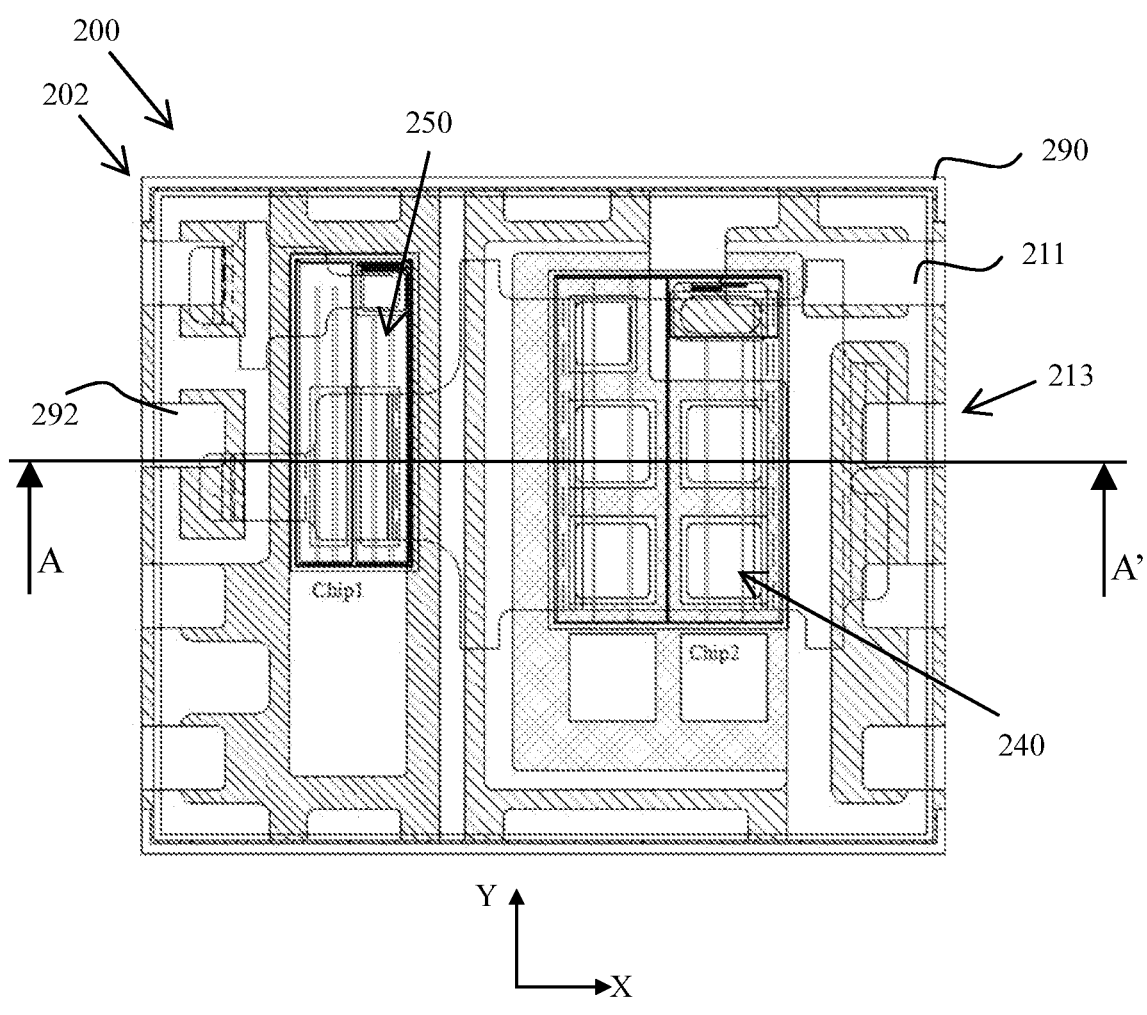
FIG. 2A is a top view and FIG. 2B is a cross sectional plot along AA' of FIG. 2A of a semiconductor package.
Figure 2B:
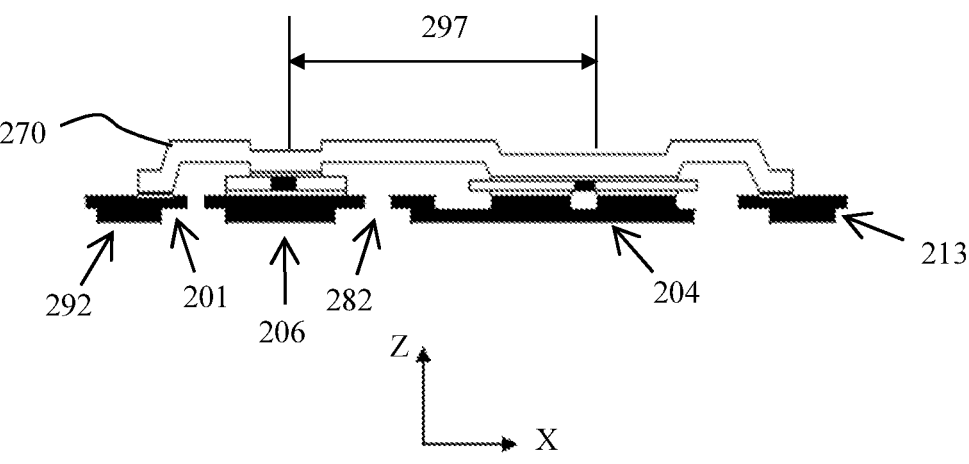

FIG. 2A is a top view and FIG. 2B is a cross sectional plot along AA' of FIG. 2A of a semiconductor package 200. The semiconductor package 200 comprises a low side FET 240 and a high side FET 250. A length along Y direction is 5 mm. A width along X direction is 6 mm. There is a gap between the drain electrode of the high side FET 250 and the source electrode of the high side FET 250. A voltage input (Vin) lead 292 of a lead frame 202 is of a full thickness, along Z direction. A half thickness section 201 of FIG. 2B, also as indicated by the hatching area in FIG. 2A that may be formed through half etching process. A locking feature 282 facilitating material integration of the lead frame 202 and a molding encapsulation 290 is disposed between a first die paddle 204 and a second die paddle 206. A distance 297 between a center of a first flat portion of the metal clip 270 contacting the low side FET 240 and a center of a second flat portion of the metal clip 270 contacting the high side FET 250 is of a predetermined value. A longitudinal direction, along X direction, of a gate lead 211 is parallel to a longitudinal direction, along X direction, of each of one or more switching node (Lx) leads 213.

Figure 3A:
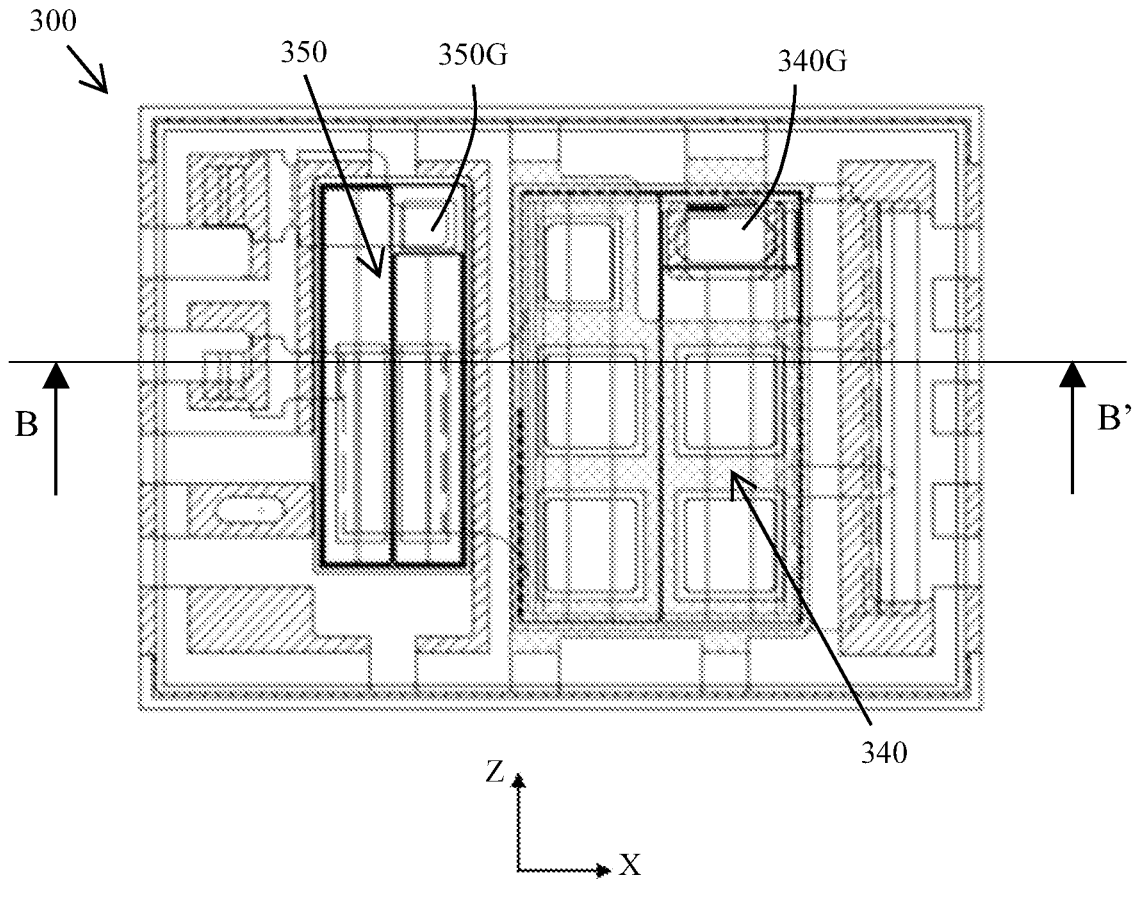
FIG. 3A is a top view.
Figure 3B:
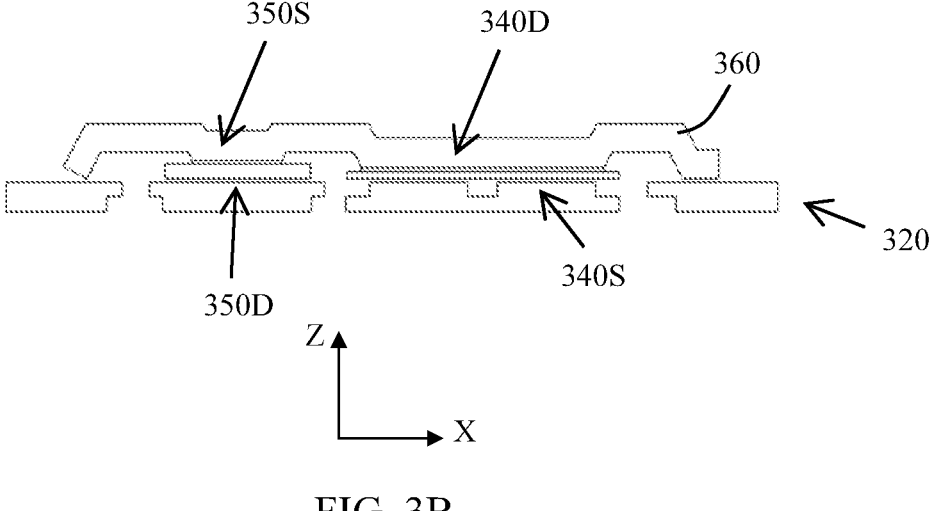
FIG. 3B is a cross sectional plot along BB' of FIG. 3A.
Figure 3C:
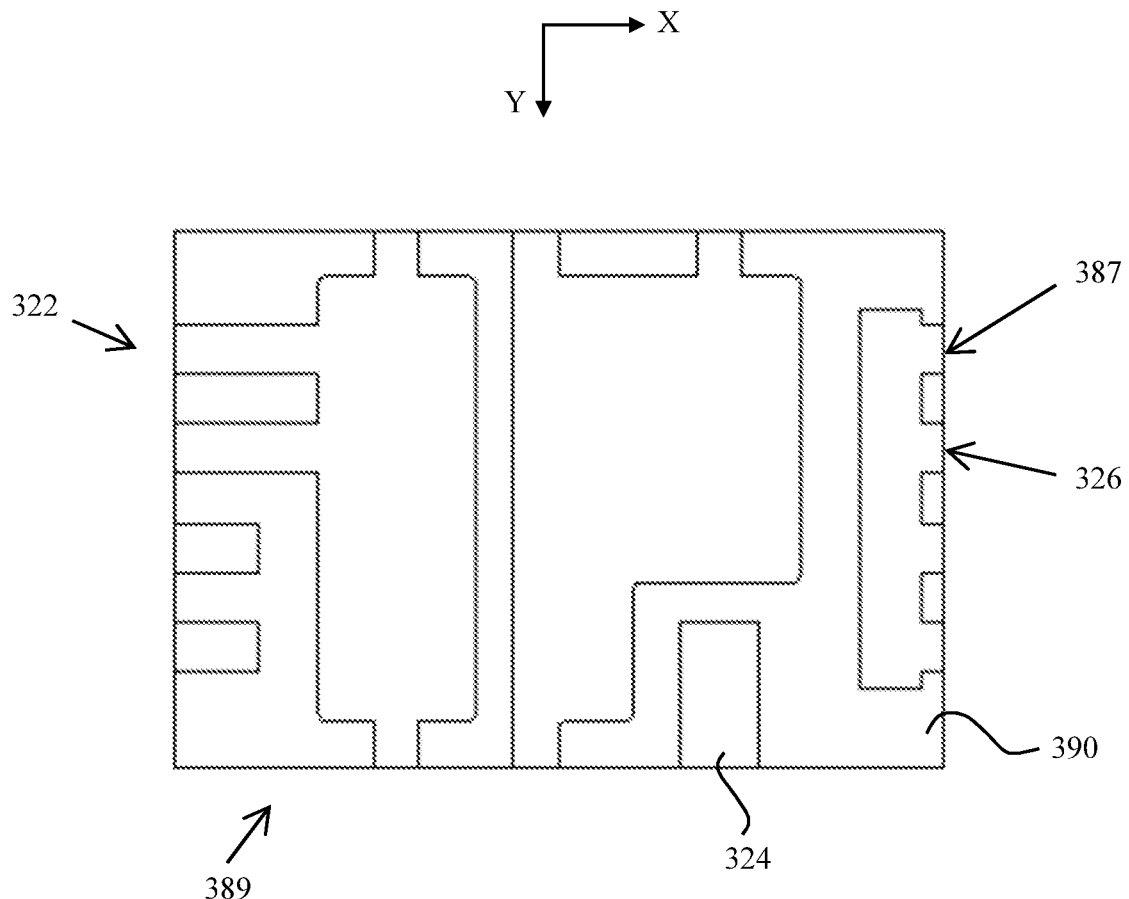
FIG. 3C is a bottom view of a semiconductor package in examples of the present disclosure.

FIG. 3A is a top view; FIG. 3B is a cross sectional plot along BB' of FIG. 3A; and FIG. 3C is a bottom view of a semiconductor package 300 in examples of the present disclosure. In one example, the semiconductor package 300 is a DC-DC converter. The semiconductor package 300 comprises a lead frame 320 of FIGS. 3B, 4A, and 4B, a low side field-effect transistor (FET) 340, a high side FET 350, a metal clip 360 of FIG. 3B and FIG. 5, and a molding encapsulation 390 of FIG. 3C. The lead frame 320 comprises one or more Vin leads 322 of FIG. 3C; a gate lead 324 of the low side FET 340; one or more Lx leads 326; a first die paddle 440 of FIG. 4A, a second die paddle 450 disposed alongside with the first die paddle 440 on a first side, and an end paddle 460 disposed alongside with the first die paddle 440 on a second side opposite the first side. The end paddle 460 is electrically connected to a switching node 170 of FIG. 1.

The low side FET 140 comprises a source electrode 340S of FIG. 3B and a gate electrode 340G of FIG. 3A on a top surface of the low side FET 340 and a drain electrode 340D of FIG. 3B on a bottom surface of the low side FET 340. The low side FET 340 is flipped with its source electrode 340S electrically and mechanically attached to the first die paddle 440, and its gate electrode 340G electrically and mechanically attached to the gate lead 324. The high side FET 350 comprises a source electrode 350S and a gate electrode 350G on a top surface of the high side FET 350 and a drain electrode 350D on a bottom surface of the high side FET. The high side FET 350 is attached to the second die paddle 450 with its drain electrode 350D electrically connected to the second die paddle 450.

Figures 4A, 4B:
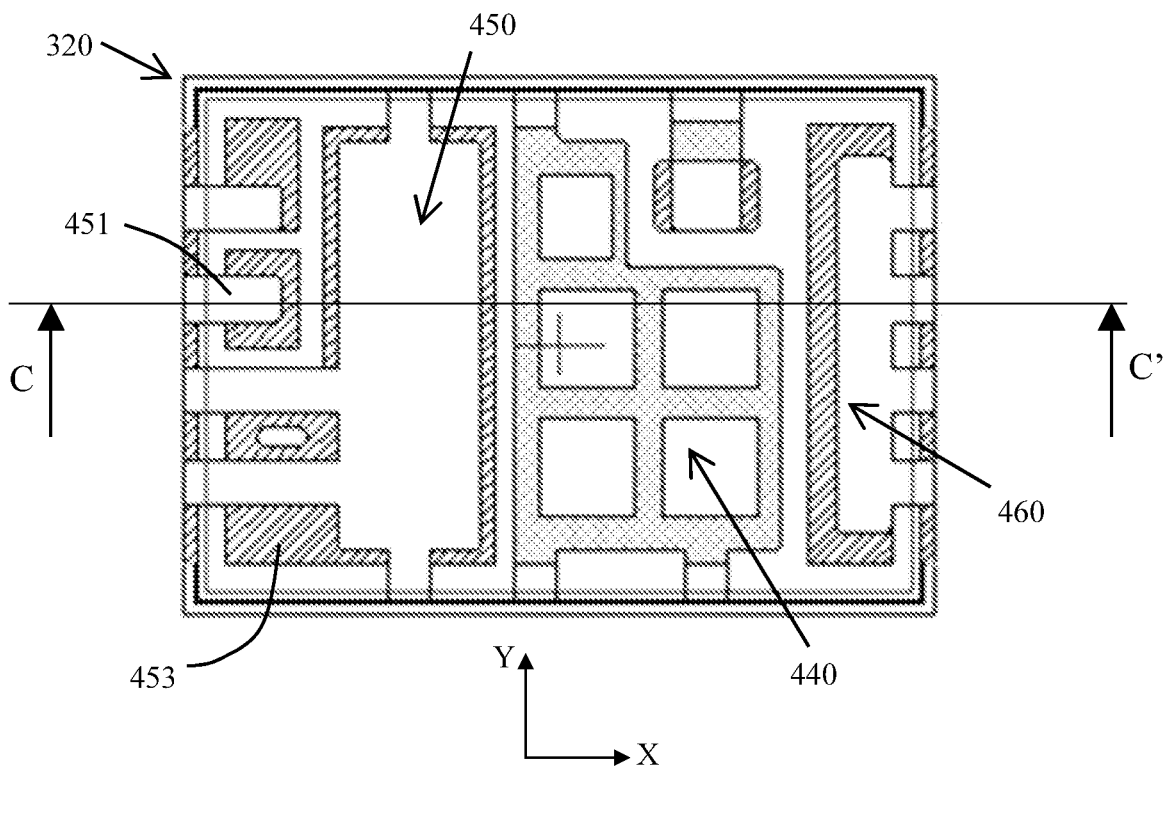
FIG. 4A is a top view and FIG. 4B is a cross sectional plot along CC' of FIG. 4A of a lead frame in examples of the present disclosure.

The metal clip 360 connects a drain electrode 340D of the low side FET 340 and the source electrode 350S of the high side FET 350 to the end paddle 460 of FIG. 4A of the lead frame 320.

The molding encapsulation 390 encloses the low side FET 340, the high side FET 350, the metal clip 360, and a majority portion of the lead frame 320. In one example, a majority portion refers to a portion larger than 50%.

Each bottom surface of the one or more Vin leads 322, the gate lead 324, the one or more Lx leads 326, the first die paddle 440, the second die paddle 450, and the end paddle 460 is exposed from the molding encapsulation 390. Each of the exposed bottom surface of the one or more Vin leads 322 is directly connected to the exposed bottom surface of the second die paddle 450.

In examples of the present disclosure, the semiconductor package 300 is of a rectangular prism shape. A length, along Y direction, of the semiconductor package 300 is less than 5 mm. A width, along X direction, of the semiconductor package 300 is less than 6 mm. In one example, the length, along Y direction, of the semiconductor package 300 is 3.5 mm and the width, along X direction, of the semiconductor package 300 is 5 mm.

Each of the exposed bottom surface of the one or more Lx leads 326 is directly connected to the exposed bottom surface of the end paddle 460 at a side of the end paddle 460 opposite the first die paddle 440 and extends away from the end paddle 460.

In examples of the present disclosure, the semiconductor package 300 is of a rectangular prism shape. The rectangular prism shape comprises a first edge 387 of FIG. 3C and a second edge 389 perpendicular to the first edge 387. The end paddle 460 runs in parallel to the first edge 387. Each of the exposed bottom surface of the one or more Lx leads 326 is directly extended to the first edge 387. The first die paddle has a L shape with a cut-off corner adjacent one end of the end paddle 460 and second edge 389. The gate lead 324 extends from a position of the cut-off corner between the first die paddle 440 and the end paddle 460 towards the second edge 389. The exposed bottom surface of the gate lead 324 is directly extended to the second edge 389.

A longitudinal direction, Y direction, of the exposed bottom surface of the gate lead 324 is perpendicular to a longitudinal direction, X direction, of each of the exposed bottom surface of the one or more Lx leads 326. A dimension along a longitudinal direction of a rectangular shape is longer than a dimension along a transverse direction of the rectangular shape.

A portion of the lead frame 320 between the first die paddle 440 and the second die paddle 450 does not include a locking feature (for example, does not include the locking feature 282 of FIG. 2B) facilitating material integration of the lead frame 320 and the molding encapsulation 390.

Figure 5:
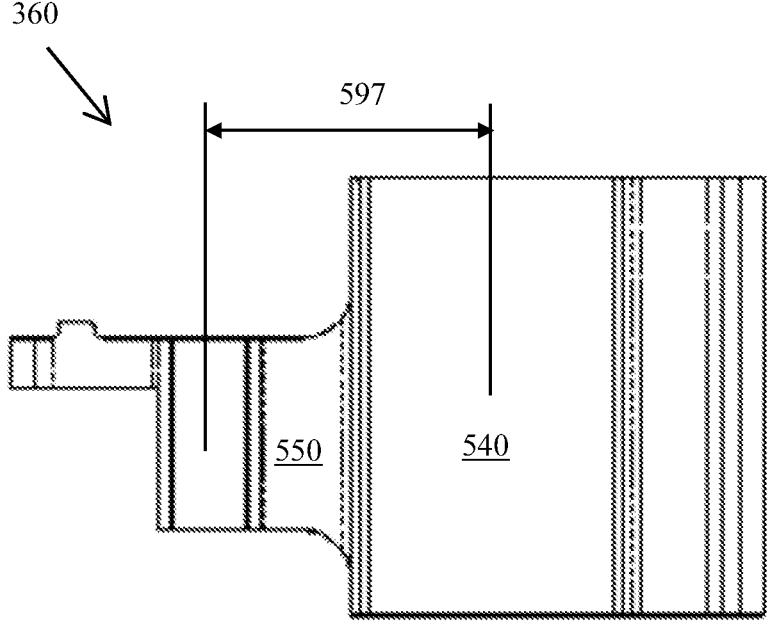
FIG. 5 is a top view of a metal clip in examples of the present disclosure.

In examples of the present disclosure, a distance 597 of FIG. 5 between a center of a first flat portion 540 of the metal clip 360 contacting the low side FET 340 and a center of a second flat portion 550 of the metal clip contacting the high side FET 350 is less than 2.4 mm. In one example, the distance 597 is 1.7 mm.

A first portion 451 of the lead frame 320 is of a full thickness. A second portion 453 of the lead frame 320 is of a partial thickness (Shown in single hatched lines of FIG. 4A). A top surface of the second portion 453 is coplanar with a top surface of the first portion 451. A third portion 455 of the lead frame 320 is of a partial thickness (shown in crossed hatched lines of FIG. 4A). A bottom surface of the third portion 455 is coplanar with a bottom surface of the first portion 451. An entirely of each of the one or more Vin leads 322 is of the full thickness. In examples of the present disclosure, the partial thickness is half of the full thickness. The partial thickness may be done by an etching process.

Reduction in size from 5 mm by 6 mm of FIG. 2A to 3.5 mm by 5 mm of FIG. 3A results in reduced exposed bottom surface of the lead frame 320 affecting thermal dissipation. More exposed bottom surface of the lead frame 320 is added, for example, the exposed bottom surface of the end paddle 460, so as to achieve similar thermal dissipation.

Parasitic inductance is reduced because of smaller distance between the low side FET 340 and the high side FET 350 of FIG. 3A than that between the low side FET 240 and the high side FET 250 of FIG. 2A. The lower bound value of the distance between the low side FET 340 and the high side FET 350 of FIG. 3A is determined by the insulation requirement and manufacturing tolerance.

The advantage of present disclosure includes reduction of semiconductor package size; reduction of cost; reduction of parasitic inductance; reduction of voltage spike of the high side FET 350 thereby improving the reliability performance of the semiconductor package; increase of efficiency; and increase of power density.

Those of ordinary skill in the art may recognize that modifications of the embodiments disclosed herein are possible. For example, a number of the one or more Vin leads 322 may vary and a number of the one or more Lx leads 326 may vary. Other modifications may occur to those of ordinary skill in this art, and all such modifications are deemed to fall within the purview of the present invention, as defined by the claims.

The invention claimed is:

1. A semiconductor package comprising:
a lead frame comprising
one or more voltage input (Vin) leads;
a gate lead;
one or more switching node (Lx) leads;
a first die paddle;
a second die paddle; and
an end paddle;
a low side field-effect transistor (FET) being flipped and attached to the first die paddle, the low side FET comprising a source electrode and a gate electrode on a top surface of the low side FET and a drain electrode on a bottom surface of the low side FET;
a high side FET attached to the second die paddle, the high side FET comprising a source electrode and a gate electrode on a top surface of the high side FET and a drain electrode on a bottom surface of the high side FET;
a metal clip connecting the drain electrode of the low side FET and the source electrode of the high side FET to the end paddle of the lead frame; and
a molding encapsulation enclosing the low side FET, the high side FET, the metal clip, and a majority portion of the lead frame;
wherein each bottom surface of the one or more Vin leads, the gate lead, the one or more Lx leads, the first die paddle, the second die paddle, and the end paddle is exposed from the molding encapsulation;
wherein a portion of the lead frame between the first die paddle and the second die paddle does not include a locking feature facilitating material integration of the lead frame and the molding encapsulation; and
wherein a distance between a center of a first flat portion of the metal clip contacting the low side FET and a center of a second flat portion of the metal clip contacting the high side FET is less than two point four millimeters.

2. The semiconductor package of claim 1, wherein the semiconductor package is of a rectangular prism shape;
wherein a length of the semiconductor package is less than five millimeters; and
wherein a width of the semiconductor package is less than six millimeters.

3. The semiconductor package of claim 2, wherein the length of the semiconductor package is three and half millimeters; and wherein the width of the semiconductor package is five millimeters.

4. The semiconductor package of claim 1, wherein each of the exposed bottom surface of the one or more Lx leads is directly connected to the exposed bottom surface of the end paddle.

5. The semiconductor package of claim 1, wherein the semiconductor package is of a rectangular prism shape comprising a first edge; and a second edge perpendicular to the first edge;

wherein each of the exposed bottom surface of the one or more Lx leads is directly extended to the first edge; and wherein the exposed bottom surface of the gate lead is directly extended to the second edge.

6. The semiconductor package of claim 5, wherein a longitudinal direction of the exposed bottom surface of the gate lead is perpendicular to a longitudinal direction of each of the exposed bottom surface of the one or more Lx leads.

7. The semiconductor package of claim 1, wherein the distance is one point seven millimeters.

8. The semiconductor package of claim 1, wherein a first portion of the lead frame is of a full thickness;

wherein a second portion of the lead frame is of a partial thickness; and wherein an entirely of each of the one or more Vin leads is of the full thickness.

9. The semiconductor package of claim 8, wherein the partial thickness is half of the full thickness.

10. The semiconductor package of claim 1, wherein the semiconductor package is a DC-DC converter.

11. A semiconductor package comprising:

a lead frame comprising one or more voltage input (Vin) leads;

a gate lead;

one or more switching node (Lx) leads;

a first die paddle;

a second die paddle; and an end paddle;

a low side field-effect transistor (FET) being flipped and attached to the first die paddle, the low side FET comprising a source electrode and a gate electrode on a top surface of the low side FET and a drain electrode on a bottom surface of the low side FET;

a high side FET attached to the second die paddle, the high side FET comprising a source electrode and a gate electrode on a top surface of the high side FET and a drain electrode on a bottom surface of the high side FET;

a metal clip connecting the drain electrode of the low side FET and the source electrode of the high side FET to the end paddle of the lead frame; and a molding encapsulation enclosing the low side FET, the high side FET, the metal clip, and a majority portion of the lead frame;

wherein a distance between a center of a first flat portion of the metal clip contacting the low side FET and a center of a second flat portion of the metal clip contacting the high side FET is less than two point four millimeters.

12. The semiconductor package of claim 11, wherein a first portion of the lead frame is of a full thickness;

wherein a second portion of the lead frame is of a partial thickness; and wherein an entirely of each of the one or more Vin leads is of the full thickness.

13. The semiconductor package of claim 12, wherein the partial thickness is half of the full thickness.

14. The semiconductor package of claim 11, wherein the semiconductor package is a DC-DC converter.

15. A semiconductor package comprising:

a lead frame comprising one or more voltage input (Vin) leads;

a gate lead;

one or more switching node (Lx) leads;

a first die paddle;

a second die paddle; and an end paddle;

a low side field-effect transistor (FET) being flipped and attached to the first die paddle, the low side FET comprising a source electrode and a gate electrode on a top surface of the low side FET and a drain electrode on a bottom surface of the low side FET;

a high side FET attached to the second die paddle, the high side FET comprising a source electrode and a gate electrode on a top surface of the high side FET and a drain electrode on a bottom surface of the high side FET;

a metal clip connecting the drain electrode of the low side FET and the source electrode of the high side FET to the end paddle of the lead frame; and a molding encapsulation enclosing the low side FET, the high side FET, the metal clip, and a majority portion of the lead frame;

wherein the semiconductor package is of a rectangular prism shape comprising a first edge; and a second edge perpendicular to the first edge;

wherein each of the exposed bottom surface of the one or more Lx leads is directly extended to the first edge;

wherein the exposed bottom surface of the gate lead is directly extended to the second edge; and wherein a distance between a center of a first flat portion of the metal clip contacting the low side FET and a center of a second flat portion of the metal clip contacting the high side FET is less than two point four millimeters.

16. The semiconductor package of claim 15, wherein a longitudinal direction of the exposed bottom surface of the gate lead is perpendicular to a longitudinal direction of each of the exposed bottom surface of the one or more Lx leads.

17. The semiconductor package of claim 15, wherein a first portion of the lead frame is of a full thickness;

wherein a second portion of the lead frame is of a partial thickness; and wherein an entirely of each of the one or more Vin leads is of the full thickness.

18. The semiconductor package of claim 17, wherein the partial thickness is half of the full thickness.

19. The semiconductor package of claim 15, wherein the semiconductor package is a DC-DC converter.

* * * * *